US005744986A

United States Patent [19]

Yamada et al.

[11] Patent Number: 5,744,986

[45] Date of Patent: Apr. 28, 1998

[54] SOURCE DRIVER CIRCUIT DEVICE HAVING IMPROVED LEVEL CORRECTION CIRCUIT FOR DRIVING LIQUID CRYSTAL DISPLAY

[75] Inventors: Shigeru Yamada, Yokohama; Tetsuro Itakura, Fujisawa, both of Japan

[73] Assignee: Kabushiki Kaisha Toshiba, Kawasaki, Japan

[21] Appl. No.: 233,930

[22] Filed: Apr. 28, 1994

[30] Foreign Application Priority Data

Apr. 28, 1993 [JP] Japan .................................... 5-103092

[51] Int. Cl.$^6$ .................................................... G11C 27/02

[52] U.S. Cl. ................................ 327/95; 327/93; 327/96

[58] Field of Search ................................ 327/87, 89, 91, 327/93, 94, 95, 96, 323

[56] References Cited

U.S. PATENT DOCUMENTS

| | | | |
|---|---|---|---|
| 5,162,670 | 11/1992 | Itakura et al. . | |
| 5,252,956 | 10/1993 | Senn et al. | 327/94 |
| 5,311,087 | 5/1994 | Suganuma | 327/94 |
| 5,343,089 | 8/1994 | Itakura et al. . | |
| 5,416,432 | 5/1995 | Lewis et al. | 327/94 |

FOREIGN PATENT DOCUMENTS

| | | |
|---|---|---|
| 2-160283 | 6/1990 | Japan . |
| 4-212794 | 8/1992 | Japan . |

*Primary Examiner*—Timothy P. Callahan
*Assistant Examiner*—Jung Ho Kim
*Attorney, Agent, or Firm*—Oblon, Spivak, McClelland, Maier & Neustadt, P.C.

[57] ABSTRACT

A source driver circuit device for decreasing a gap of output errors of a plurality of driver circuits which perform a serial/parallel conversion of a video signal, comprises a plurality of sample-and-hold circuits arranged in the order for sequentially sampling levels of an input video signal; a plurality of signal output circuits for respectively generating voltage outputs corresponding to holding levels of said plurality of sample-and-hold circuits; a plurality of reference level sample-and-hold circuits each of which is provided with each predetermined number of said sample-and-hold circuits, and for sampling a reference level; a plurality of sample value output circuits for respectively generating voltage outputs corresponding to holding levels of said plurality of reference level sample-and-hold circuits; and an output error correction circuit for performing an output level correction in each of said plurality of signal output circuits on the basis of a level difference between said reference level and an average value of a plurality of outputs issued from said plurality of sample value output circuits. Therefore, it is possible to decrease the level difference between output errors among the driver circuit device.

9 Claims, 15 Drawing Sheets

SOURCE DRIVER CIRCUIT DEVICE HAVING IMPROVED LEVEL CORRECTION CIRCUIT FOR DRIVING LIQUID CRYSTAL DISPLAY

BACKGROUND OF THE INVENTION

The present invention relates to a source driver circuit device (a serial-parallel converter) which samples and holds an analog signal and simultaneously outputs a sequential level which is sampled and held, and more particularly, to a source driver circuit device having an improved level correction circuit which is applicable to a driver portion for a source line of a liquid crystal display device.

There is described a conventional example of a driver circuit device including an output error correction circuit in reference with FIG. 1. FIG. 1 shows a driver circuit device 1 which is formed in a semiconductor integrated circuit (IC) and drives an active matrix liquid crystal display device which is not shown in this figure. The driver circuit device 1 samples a supplied video signal $V_{IN}$ corresponding to a number of display pixels and simultaneously outputs levels of entire pixels to the liquid crystal display device so as to form a screen. The driver circuit device 1 schematically comprises a sampling clock signal generation circuit 2, sample-and-hold circuits 3, *4a*, . . . , *4n*, output circuits 5, *6a*, . . . , *6n*, and an output error correction circuit 7.

The sampling clock signal generation circuit 2 sequentially generates sampling clocks $\Phi_3$, $\Phi_{4a}$, . . . , $\Phi_{4n}$ on the basis of a system clock $\Phi_8$ of the liquid crystal display device, which is supplied from an outside. A video signal $V_{IN}$ is supplied from a video signal processing circuit (not shown) to an input terminal 8 of the analog signal. The video signal $V_{IN}$ is supplied through an internal wiring to input terminals of a plurality of the sample-and-hold circuits *4a*, . . . , *4n*. The sample-and-hold circuits *4a*, . . . *4n* sequentially hold and store instantaneous values of the video signal in synchronous with a supply of the sampling clocks $\Phi_{4a}$, . . . , $\Phi_{4n}$, respectively. A reference potential signal $V_S$ (hereunder simply referred as a reference potential) is supplied to an input terminal 9 from an external circuit. The reference potential $V_S$ is supplied to the sample-and-hold circuit 3 and the output error correction circuit 7. The sample-and-hold circuit 3 holds and stores levels of the reference potential $V_S$ in synchronous with a supply of the sampling clock $\Phi_3$.

The sample-and-hold circuits 3, *4a*, . . . , *4n* simultaneously output sampled signal levels through output terminals *3t*, *4at*, . . . , *4nt* of the sample-and-hold circuit 3, *4a*, . . . , *4n* corresponding to a load signal $\Phi_L$ externally supplied.

Potential level signals which are respectively outputted from each of the sample-and-hold circuits 3, *4a*, . . . , *4n*, are supplied respectively to the output circuits 5, *6a*, . . . , *6n*, so as to output a potential corresponding to an inputted potential through output terminals *5t*, *6at*, *6nt*.

The sample-and-hold circuit 3, output circuit 5 and output error correction circuit 7 are provided for performing a level correction of entire outputs after detecting an output error mentioned later. The output error correction circuit 7 compares an output $O_5$ of the output circuit 5 corresponding to an output of the sample-and-hold circuit 3 with the reference potential $V_S$ so as to perform a level correction in the manner that a difference between the output $O_5$ and the reference potential $V_S$ closes to a zero. The level correction is performed by adding an adjusting output $O_7$ not only to the output circuit 5 but also to the output circuits *6a*, . . . , *6n*, thereby performing an error correction with respect to entire outputs. The sample-and-hold circuit 3 and output circuit 5 are provided for detecting a reference potential, while the sample-and-hold circuits *4a–4n* and output circuits *6a–6n* are provided for outputting the video signal to the liquid crystal display device. The circuits *4a–4n* are represented by a circuit 4, and the circuits *6a–6n* are represented by a circuit 6 in accordance with a necessity.

FIG. 2 shows a circuitry of a portion corresponding to the sample-and-hold circuit 3 or 4 and the output circuit 5 or 6 in the conventional example.

In FIG. 2, the sample-and-hold circuit 3 comprises transistors $Q_1$–$Q_4$ and capacitors $C_1$ and $C_2$. When the sampling clocks $\Phi_3$ and $*\Phi_3$ are supplied to gates of the transistors $Q_1$ and $Q_2$ as analog switches, the capacitor $C_1$ holds charges corresponding to an instantaneous value of an amplitude of the video signal $V_{IN}$.

Next, when the load clocks $\Phi_L$ and $*\Phi_L$ are supplied to gates of the transistors $Q_3$ and $Q_4$ as analog switches, the (level) charges kept in the capacitor $C_1$ are transferred to the capacitor $C_2$, thereby supplying a holding level to the output circuit. Here, the clocks $*\Phi_3$ and $*\Phi_4$L denote inverted signals of the clocks $\Phi_3$ and $\Phi_L$, respectively.

The output circuit 5 comprises transistors $Q_5$–$Q_{11}$, current sources $I_1$ and $I_2$, and a capacitor $C_3$. The transistors $Q_5$ and $Q_6$ are connected in series each other between power sources, in which the adjusting output $O_7$ is supplied to a gate of the transistor $Q_5$ and an output of the sample-and-hold circuit 3 is supplied to a gate of the transistor $Q_6$. A potential of a junction point of the transistors $Q_5$ and $Q_6$ is "$V_{in}$–ΔV", where $V_{in}$ denotes an output level of the sample-and-hold circuit 3 and ΔV denotes an output level of the adjusting output $O_7$. The level of "$V_{in}$–ΔV" is outputted to an output terminal *5t* through a voltage source follower which is comprised of the transistors $Q_7$–$Q_{11}$, the current sources $I_1$ and $I_2$, and the capacitor $C_3$ for preventing oscillation.

FIG. 3 shows an example of the output error correction circuit 7. In FIG. 3, a differential amplifier of a current output type is comprised of transistors $Q_{21}$ and $Q_{24}$, and a current source $I_{21}$.

The differential amplifier receives the reference potential $V_S$ and the output $O_5$ and issues a current corresponding to "$O_5$–$V_S$". The current is converted into a voltage level by the transistors $Q_{25}$ and $Q_{26}$, thereby outputting as the adjusting output $O_7$.

As shown in FIG. 4, in the case where the above-mentioned integrated driver circuit device is used for driving source lines of the active matrix liquid crystal display device, since the liquid crystal display device has a large number of pixels and a large number of source lines, it is necessary to provide a plurality of driver circuit devices, for example, driver circuit devices 1L and 1R which are used in parallel location.

In the conventional device, one driver circuit only has respective one of the level sampling circuit 3 and output circuit 5, and corrects a level shift (error) of the entire outputs of the device by the reference potential $V_S$ which is detected by only one level sampling circuit and output circuit.

Therefore, when a discrepancy of the output error in the driver circuit devices 1L and 1R is distributed in a condition shown in FIG. 5A, for example, the driver circuit device 1L performs an output error correction on the basis of an output error D1L, and the driver circuit device 1R performs an output error correction on the basis of an output error D1R, respectively. As a result of the error correction, it happens that a large level difference occurs at a boundary portion of the driver circuit devices as shown in FIG. 5B.

SUMMARY OF THE INVENTION

In view of the above-mentioned condition, an object of the present invention is to provide a source driving circuit device capable of decreasing a level difference or gap in which the output errors occurring in the driving circuit devices have a discrepancy one another in the case of using a plurality of driving circuits which samples an analog signal and converts the analog signal by a serial/parallel conversion so as to synchronously generate a parallel output.

In order to achieve the above object, a source driving circuit device according to a first aspect of the present invention is characterized in comprising a plurality of signal sample-and-hold circuits arranged in the order for sequentially sampling levels of input signals, a plurality of signal output circuits for respectively generating voltage outputs corresponding to holding levels in each of the plurality of signal sample-and-hold circuits, a plurality of reference level sample-and-hold circuits for respectively sampling a reference level, a plurality of sample value output circuits, and an output error correction circuit for correcting output levels of each of the plurality of signal output circuits on the basis of a level difference between the reference level and an averaged value of each output from the plurality of signal sample-and-hold circuits.

Furthermore, a source driving circuit device according to a second aspect of the present invention is characterized in comprising a plurality of signal sample-and-hold circuits arranged in the order for sequentially sampling levels of input signals, a plurality of signal output circuits for respectively generating voltage outputs corresponding to holding levels in each of the plurality of signal sample-and-hold circuits, a plurality of reference level sample-and-hold circuits provided at least on one side of the plurality of signal sample-and-hold circuits for respectively sampling a reference level, a plurality of sample value output circuits, and an output error correction circuit for correcting output levels of each of the plurality of signal output circuits on the basis of a level difference between an external reference level supplied from an outside and an output of sample value output circuit.

In the first aspect of the present invention, one source driving circuit has the plurality of sample-and-hold circuits and output circuits which are arranged in a proper interval for detecting a common reference level, and performs an error correction of the entire outputs on the basis of the average value of a plurality of output errors detected by sampling by a plurality of level sample-and-hold circuits.

In the second aspect of the present invention, one source driving circuit has the plurality of sample-and-hold circuits and output circuits provided at one end of the plurality of signal sample-and-hold circuits, and performs a level error correction of the entire outputs on the basis of a level difference between both of the level sample-and-hold and output circuits arranged in this driver circuit and an adjacent driving circuit.

As described above, by the driver circuit according to the first aspect of the present invention, it is possible to perform a level regulation in the manner that the average value of the plurality of output errors in each source driver circuit approximates to zero, thereby decreasing a level gap between of adjacent source driver circuits in comparison with the conventional source driver circuit.

Furthermore, by the driver circuit according to the second aspect of the present invention, since it is possible to forcibly perform a level error correction in the manner that the output errors on the boundary portion between at least two adjacent integrated circuit chips coincide with each other, the level gap between the source driver IC chips further decreases less than the conventional driver circuit.

DETAILED DESCRIPTION OF THE PREFERRED EMBODIMENTS

There will be described in detail a source driver circuit device according to preferred embodiments of the present invention in reference with the accompanied drawings. At first, the point aimed at the present invention is described.

In the prior art, one source driver circuit device has a reference level sample-and-hold circuit for detecting a reference level $V_S$ externally supplied and an output circuit for outputting an internal reference level $V_R$ generated on the basis of the reference level $V_S$, thereby performing an output error correction corresponding to the reference level $V_S$ and the internal reference level $V_R$. Therefore, when a plurality of driver circuit devices are provided in parallel for a use, an output level difference generated by an individual difference of each of semiconductor integrated circuit becomes large by operation for an error correction. The present invention uses alone or in a combination of the following two functions:

1) In one source driver circuit device, an entire output error is corrected by using an average value of a plurality of output errors on the basis of reference levels which are detected by two or more than two level sample-and hold circuits and output circuits arranged at proper and arbitrary portions on the semiconductor IC chip. Since the correction is performed on the basis of an error approximated to a center value of the discrepancy of output errors, an output error gap decreases among a plurality of semiconductor integrated circuit devices. Two or more than two level sample-and-hold circuits and output circuits for obtaining an output difference are arranged not only at portions which are distant from one another but also at a portion which is adjacent to an output portion corresponding to a boundary between a plurality of integrated circuit devices, thereby increasing an effect more and more.

2) An entire output error correction is performed in the manner that there is little difference between an output of the level sample-and-hold circuits and output circuits in one source driver circuit device and an output of the level sample-and-hold circuits and output circuits in the other source driver circuit device which is provided in a portion adjacent to one source driver circuit device, thereby decreasing an output gap among a plurality of integrated circuit devices.

There is a larger effect by an arrangement that the level sample-and-hold circuits and output circuits for obtaining an output difference are located near the level sample-and-hold circuit and output circuit as an output portion of the adjacent IC chip corresponding to a junction portion of the chips.

Figure 1:
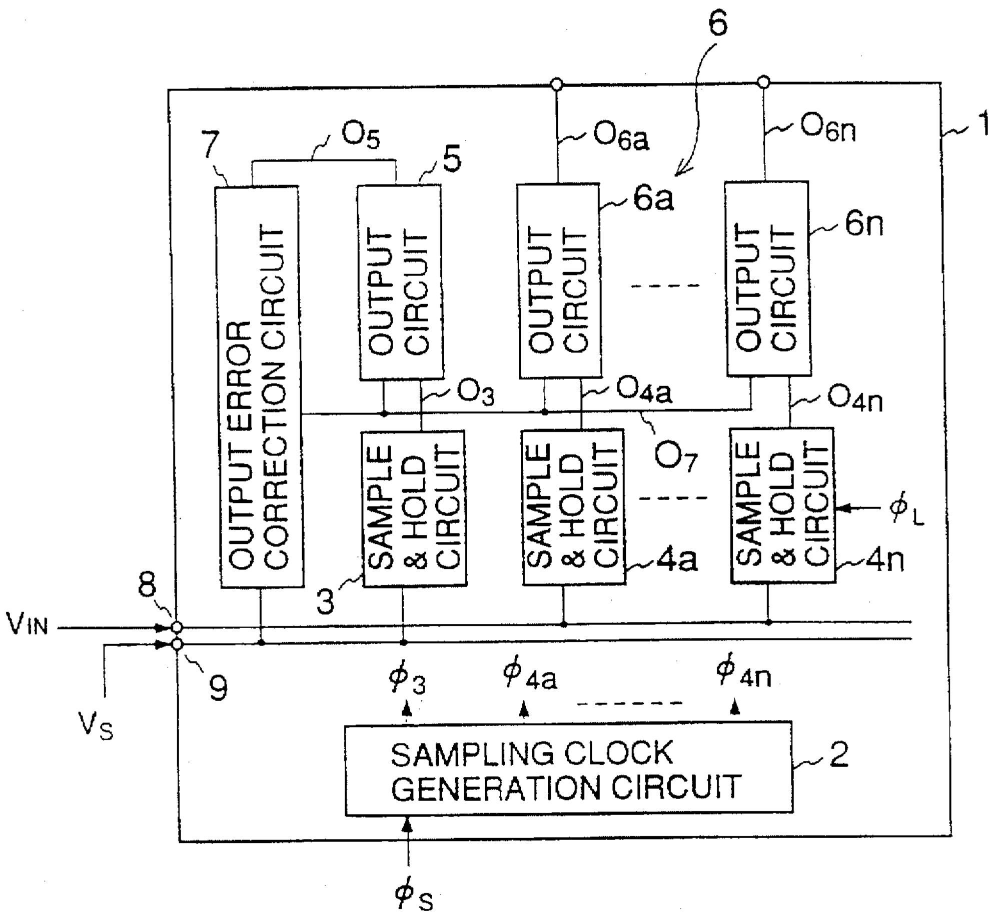
FIG. 1 PRIOR ART
FIG. 1 is a block diagram showing a configuration of the conventional source driver circuit for driving a liquid crystal display device.
Figure 6:
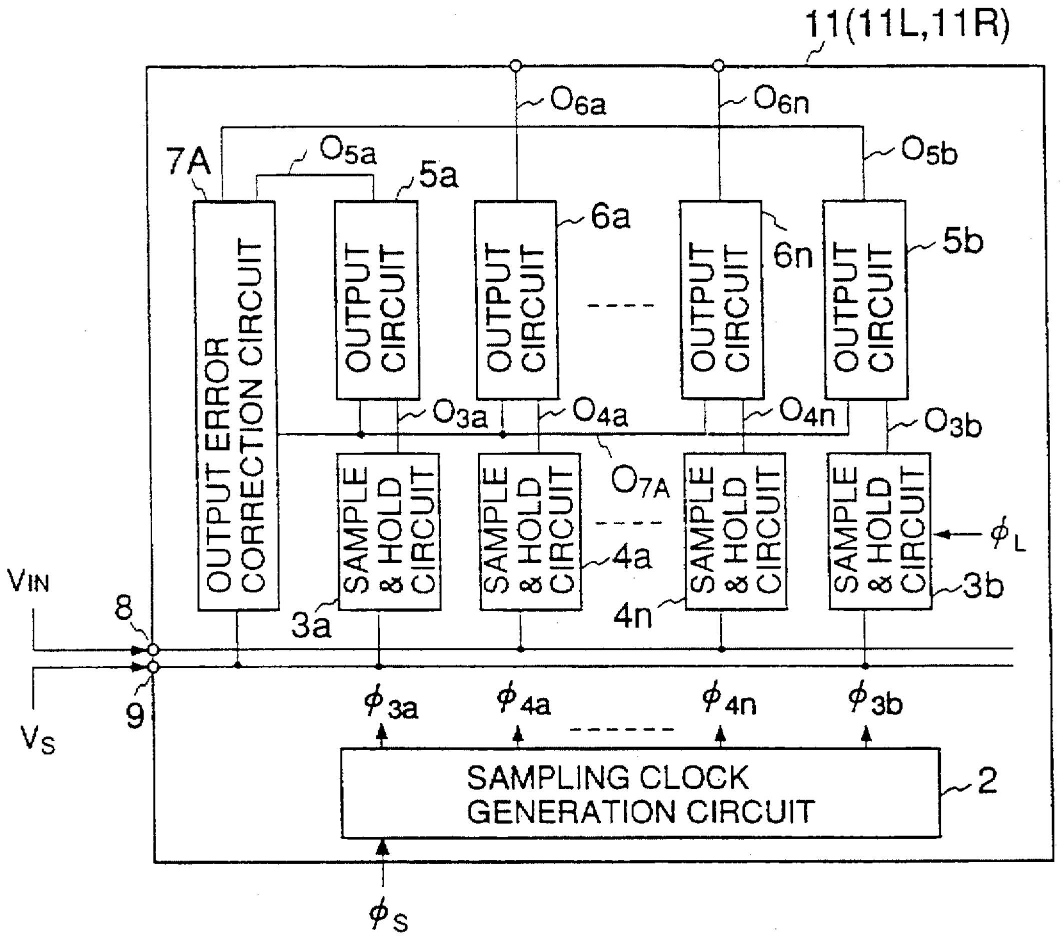
FIG. 6 is a block diagram showing a construction of a source driver circuit device according to a first embodiment of the present invention for driving a liquid crystal display device.

FIG. 6 shows a source driver circuit device according to a first embodiment of the present invention, and uses the same numerals in FIG. 1 to portions corresponding to those in FIG. 1.

In FIG. 6, a source driver circuit device 11 schematically comprises a sampling clock generation circuit 2, level sample-and-hold circuits 3*a* and 3*b*, signal sample-and-hold circuits 4*a*–4*n*, detected level output circuits 5*a* and 5*b*, signal output circuits 6*a*–6*n*, and an output error correction circuit 7A.

The sampling clock generation circuit 2 sequentially generates sampling clocks $\Phi_{3a}$, $\Phi_{4a}$, . . . , $\Phi_{4n}$ and $\Phi_{3b}$ on the basis of a system clock $\Phi_S$ of a liquid crystal display device which is externally supplied. A video signal $V_{IN}$ is supplied from a video signal processing circuit (not shown) to an input terminal 8 of an analog signal. The video signal $V_{IN}$ is supplied to input terminals of a plurality of the signal sample-and-hold circuits 4*a*–4*n* through an internal wiring. The signal sample-and-hold circuits 4*a*–4*n* sequentially hold instantaneous values of the video signal to be stored in synchronous with a supply of the sampling clocks $\Phi 4a$–$\Phi 4n$. A reference potential $V_S$ is supplied from the outside to an input terminal 9. The reference potential $V_S$ is supplied through an internal wiring to the level sample-and-hold circuits 3*a*–3*b* and the output error correction circuit 7A. The level sample-and-hold circuit 3*a* holds and stores a level of the reference potential $V_S$ in synchronous with the supply of the sampling clock $\Phi_{3a}$. The level sample-and-hold circuit 3*b* holds and stores a level of the reference potential $V_S$ in synchronous with the supply of the sampling clock $\Phi_{3b}$.

The sample-and-hold circuits 3*a*, 3*b* and 4*a*–4*n* simultaneously output through output terminals 3*at*, 3*bt* and 4*at*–4*nt* the signal levels $S_{3a}$, $S_{3b}$ and $S_{4a}$–$S_{4n}$ which are sampled corresponding to a load signal $\Phi_L$ supplied externally.

The voltage level signals $S_{3a}$, $S_{3b}$ and $S_{4a}$–$S_{4n}$ which are outputted from the sample-and-hold circuits 3*a*, 3*b* and 4*a*–$4_n$, are supplied to the output circuits 5*a*, 5*b* and 6*a*–6*n* which respectively output potentials $O_{5a}$, $O_{5b}$ and $O_{6a}$–$O_{6n}$ through output terminals 5*at*, 5*bt* and 6*at*–6*nt* corresponding to input potentials.

The sample-and-hold circuits 3*a* and 3*b*, the output circuits 5*a* and 5*b* and the output error correction circuit 7 are provided for a level correction of the entire outputs by detecting the output errors. The output error correction circuit 7 compares an average value "$(O_{5a}+O_{5b})/2$" of both outputs from the output circuits 5*a* and 5*b* for outputting the sampled values of the reference potential $V_S$, with the reference potential $V_S$, thereby performing a level correction in the manner of approximating the difference thereof to a zero. The level correction is performed by supplying the regulation output $O_{7A}$ not only to the output circuits 5*a* and 5*b* but also to the output circuits 6*a*–6*n*, and the error correction is performed with respect to the entire outputs.

Furthermore, a plurality of level sample-and-hold circuits 3 and output circuits 5 for reference potential $V_S$ may be provided between an n-number of signal sample-and-hold circuits 4*a*–4*n* for detecting an output error. This arrangement can be inserted into a predetermined number of signal sample-and-hold circuit 4*n*, for example, by an arrangement pattern represented by a progression of a fixed natural number. The output error correction circuit 7A further receives an output error which is detected by the inserted level sample-and-hold circuit and output circuit, thereby obtaining an average value of the output errors including the error from the inserted circuits.

Figure 5A:
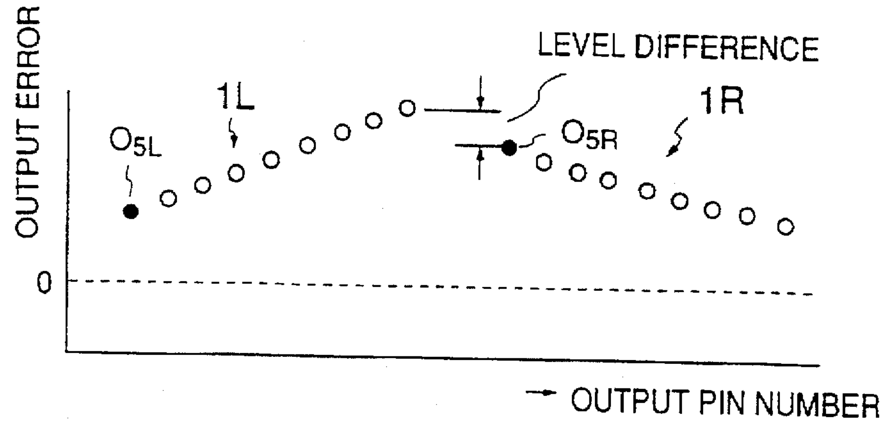
FIG. 5A PRIOR ART
FIG. 5A is a graph showing an example of output errors before a correction in the source driver circuit device shown in FIG. 4.
Figure 7:
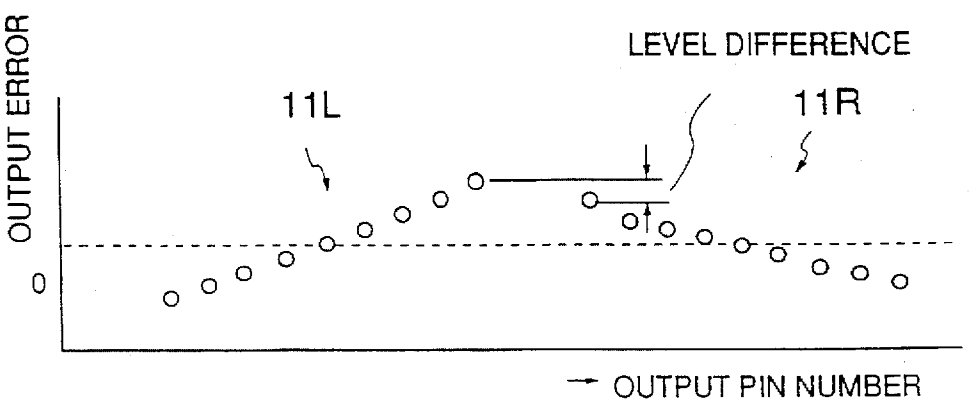
FIG. 7 is a graph showing an output error characteristic in the driver circuit according to the first embodiment.

As a result, a trend of the original output error shown in FIG. 5A is corrected in the manner of being shown in FIG. 7, thereby decreasing a level difference at the boundary portion between the source driver circuit devices.

Figure 8:
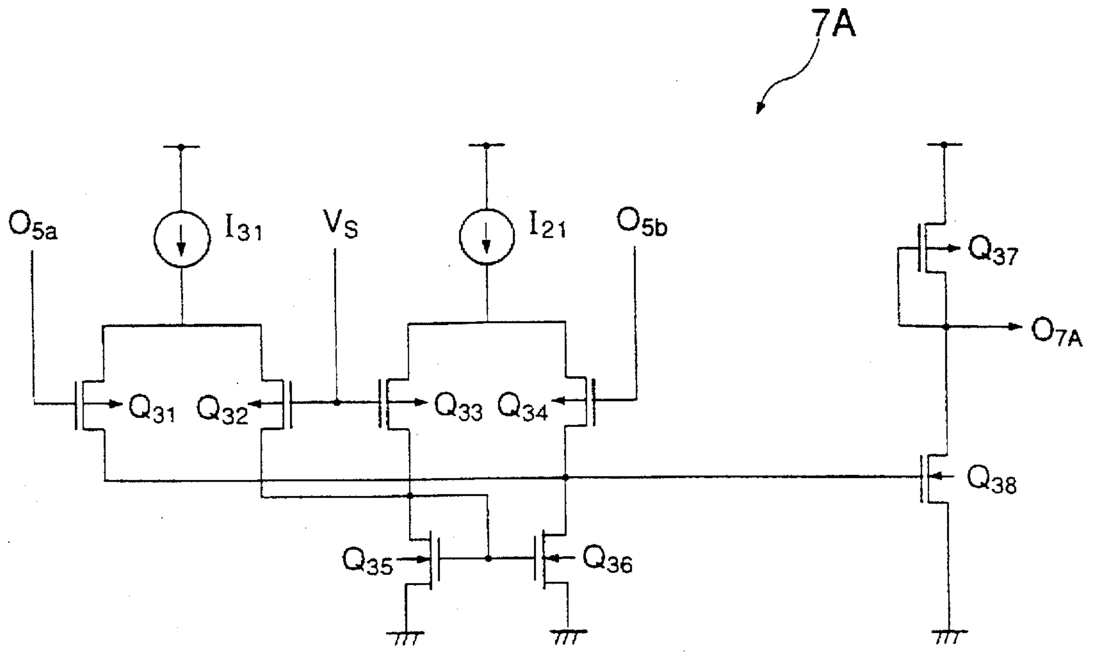
FIG. 8 is a circuit diagram showing a constructive example of an output error correction circuit shown in FIG. 6.

FIG. 8 shows a constructive example of the output error correction circuit which is used in the first embodiment. In FIG. 8, a first differential amplifier is comprised of transistors Q31 and Q32 and a current source I31. A second differential amplifier is comprised of transistors Q33 and Q34 and a current source I32. The first and second differential amplifiers are connected by a current mirror circuit including transistors Q35 and Q36. An output of "$O_{5a}$–$V_S$" is obtained by the first differential amplifier to which the output $O_{5a}$ and reference potential $V_S$ are supplied. An output of "$O_{5b}-V_S$ " is obtained by the second differential amplifier to which the output $O_{5b}$ and reference potential $V_S$ are supplied. These outputs are combined in the current mirror circuit and an output of $(O_{5a}+O_{5b}-2V_S)$ is issued from a junction point of the transistors Q34 and Q36. This corresponds to a comparison of the reference potential $V_S$ and a value of "$(O_{a5}+O_{5b})/2$". This current output is converted into a voltage output by the transistors Q37 and Q38 which are connected in series between the circuit sources, thereby supplying the voltage output as an output $O_{7A}$ to each output circuit.

Since the configuration of the conventional circuit can be used in the configuration of the sample-and-hold circuits 3*a*, 3*b* and 4*a*–4*n* and the output circuits 5*a*, 5*b* and 6*a*–6*n*, a duplicated description will be omitted.

Figure 9:
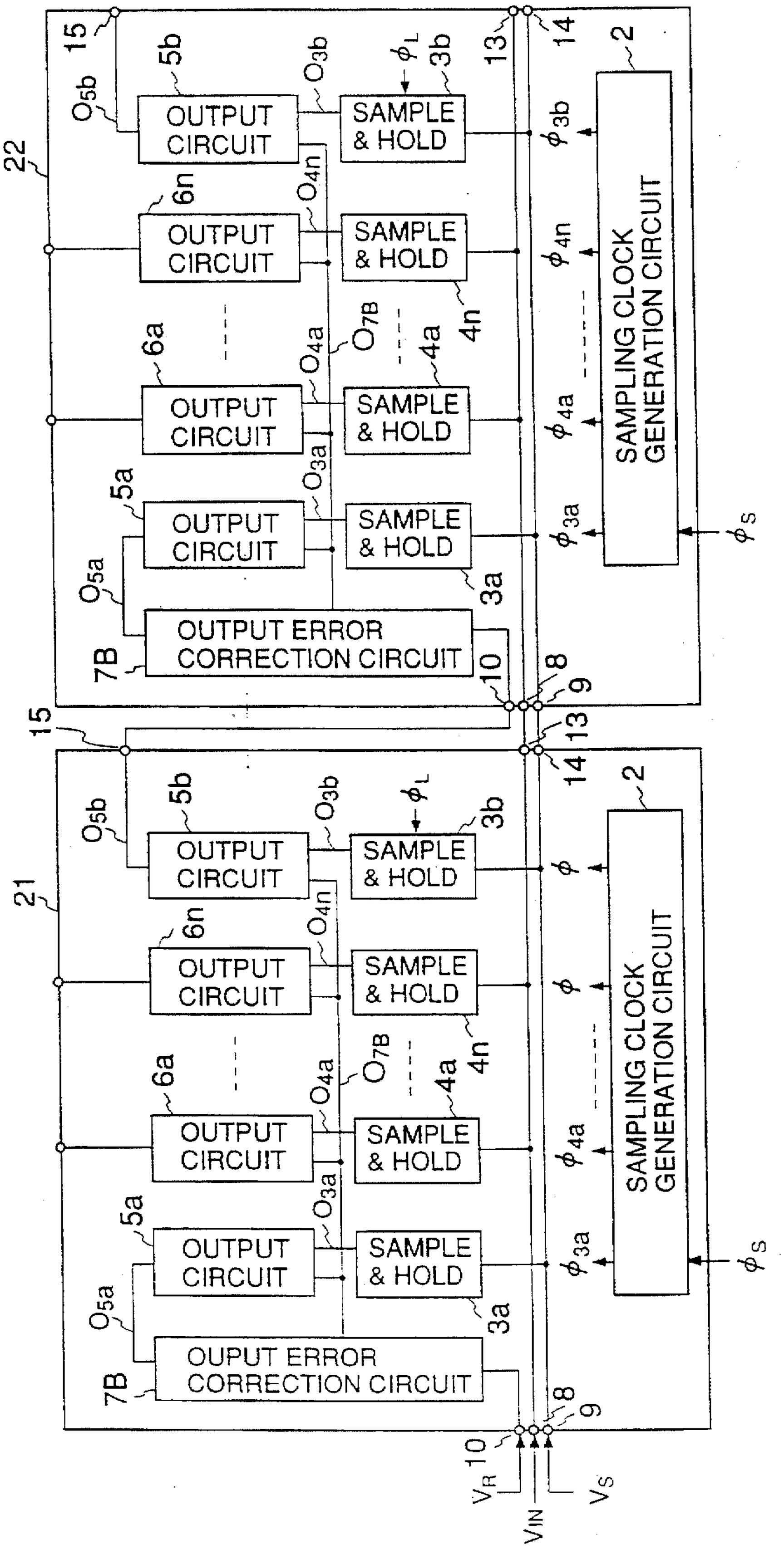
FIG. 9 is a block diagram showing a construction of a source driver circuit device according a second embodiment of the present invention for driving a liquid crystal display device.

FIG. 9 shows a source driver circuit device according to a second embodiment of the present invention. In FIG. 9, components corresponding to those shown in FIG.6 are attached by the same numerals in FIG. 6, thereby eliminating a duplicated description.

In the second embodiment, the source driver circuit devices prevent an occurrence of a level difference of the output at the boundary portions of a plurality of driver circuit devices which are connected in parallel. Accordingly, the driver circuit device of this embodiment eases a luminance difference which is caused by an individual difference of the driver circuit device and occurs at the boundary portion of the display allotment regions of the liquid crystal panel.

Figure 3:
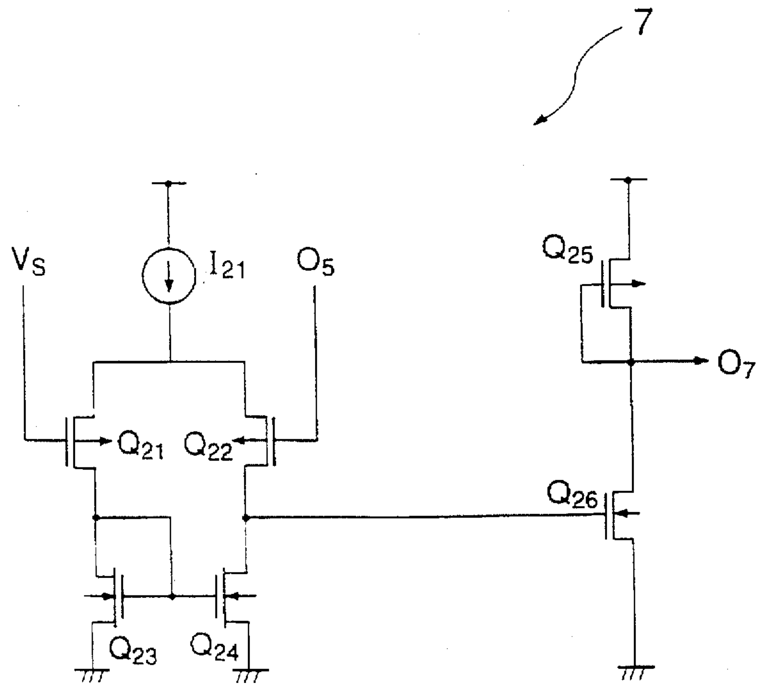
FIG. 3 PRIOR ART
FIG. 3 is a circuit diagram showing a constructive example of an output error correction circuit.
Figure 4:
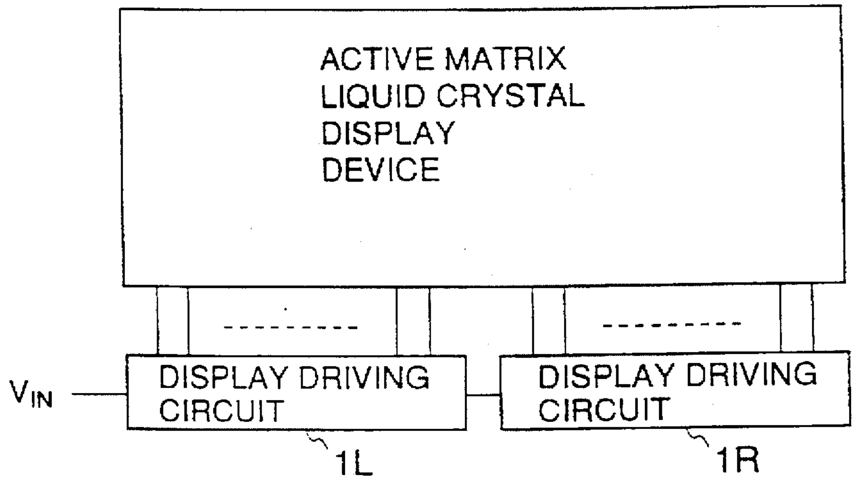
FIG. 4 PRIOR ART
FIG. 4 is an explanatory view showing a driving example by using a plurality of source driver circuit devices for an active matrix liquid crystal display device.

The video signal $V_{IN}$ and the reference potential $V_S$ are supplied from the outside to input terminals 8 and 9 of the driver circuit devices 21 and 22 having the same configuration, respectively. Furthermore, the driver circuit devices 21 and 22 comprise a third input terminals 10, respectively. One of input terminals of the output error correction circuit 7B of the driver circuit 21 is connected through the third input terminal 10 to the second reference potential $V_R$. One input terminals of output error correction circuit 7B of the driver circuit 22 is connected through the third input terminal 10 to the output $O_{5b}$ of the output circuit 5*b* of the driver circuit 21, the output $O_{5b}$ which functions as the second reference potential $V_R$. The output error correction circuit 7B compares the output $O_{5a}$ of this circuit with the second reference potential $V_R$ (the output $O_{5b}$ of the previous circuit) to obtain the level difference signal, and has the same configuration of the conventional output error correction circuit 7, for example, the configuration of the differential amplifier shown in FIG. 3. Other configurations are the same as the driver circuit device shown in FIG. 6.

In such a configuration, operation of the output error correction circuit 7B of the driver circuit 21 and the output error correction circuit 7B of the driver circuit 22 is described with reference to FIG. 10. The correction circuit 7B in the driver circuit 21 performs an output error correction as the same as the conventional circuit, namely, controls a regulation output $O_{7B}$ in the manner of introducing the output $O_{5a}$ of the output circuit 5*a* into the reference potential $V_S$. The correction circuit 7B of the driver circuit 22 controls the regulation output $O_{7B}$ in the manner of coinciding the output $O_{5a}$ of the output circuit of the driver circuit 22 with the output $O_{5b}$ of the output circuit 5*b* of the driver circuit 22.

Figure 5B:
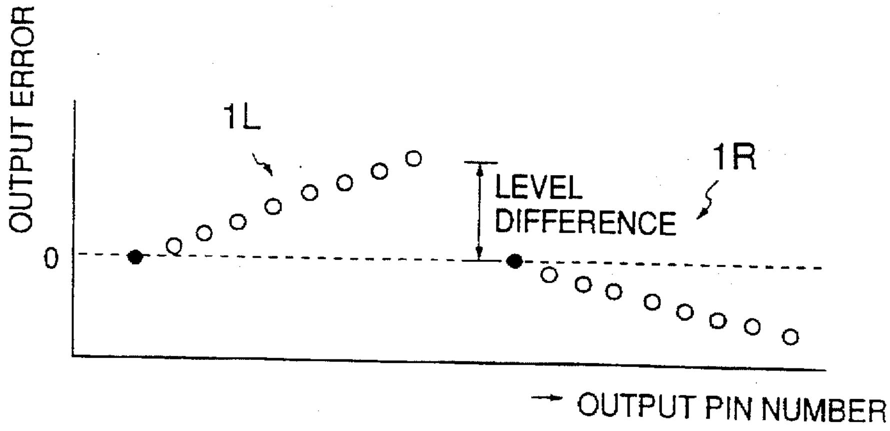
FIG. 5B PRIOR ART
FIG. 5B is a graph showing an example in which an output error correction is performed by the conventional construction shown in FIG. 1.
Figure 10:
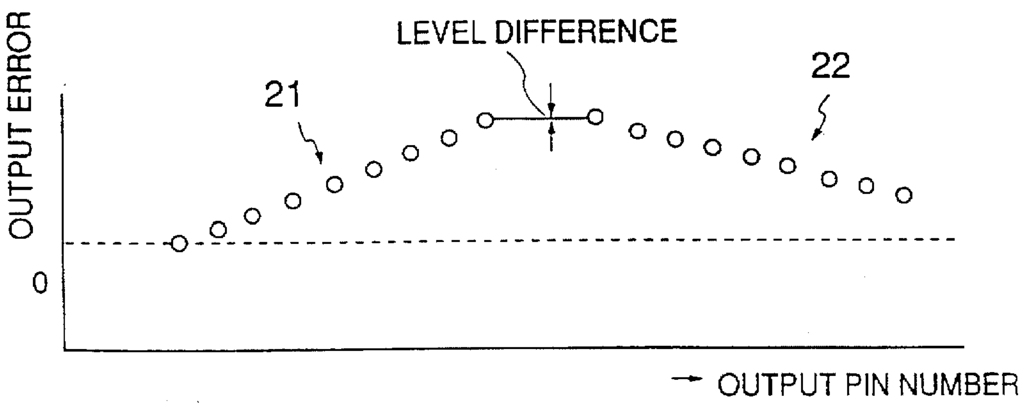
FIG. 10 is a graph showing an output error characteristic in the driver circuit device according to the second embodiment of the present invention.

As a result, the output error shown in FIG. 5A or FIG. 5B is corrected in the manner of being shown in FIG. 10, thereby decreasing the gap between the driver circuits. Furthermore, the discrepancy of the output errors decreases.

Figure 11:
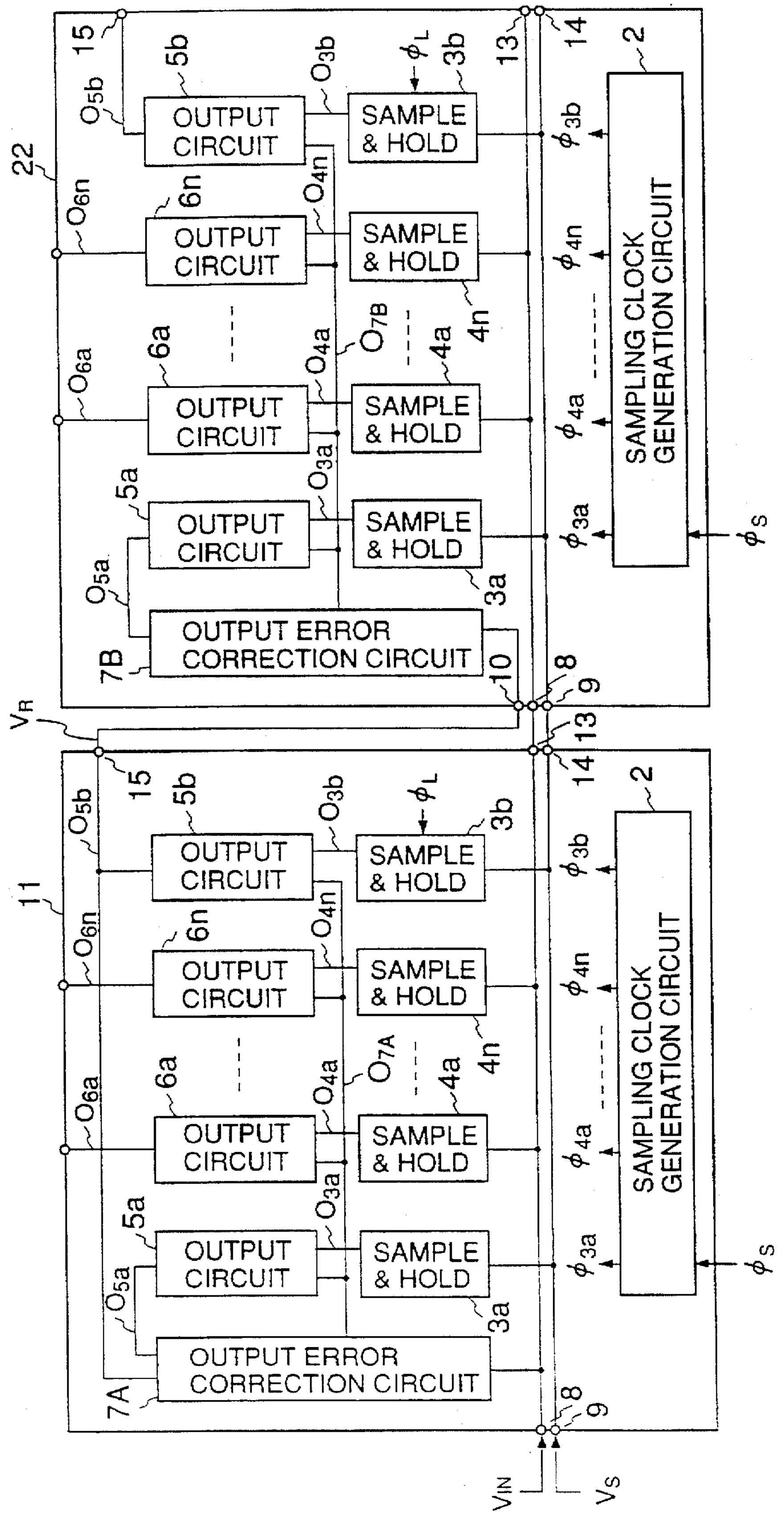
FIG. 11 is a block diagram showing a construction of a source driver circuit device according a third embodiment of the present invention for driving a liquid crystal display device.

FIG. 11 shows a third embodiment which is combined by the driver circuit device 11 shown in FIG. 6 and the driver circuit device 21 shown in FIG. 9. In this case, it is possible to obtain a characteristic in which the level difference further decreases on the boundary of the output groups 11L and 11R each other.

Figure 12:
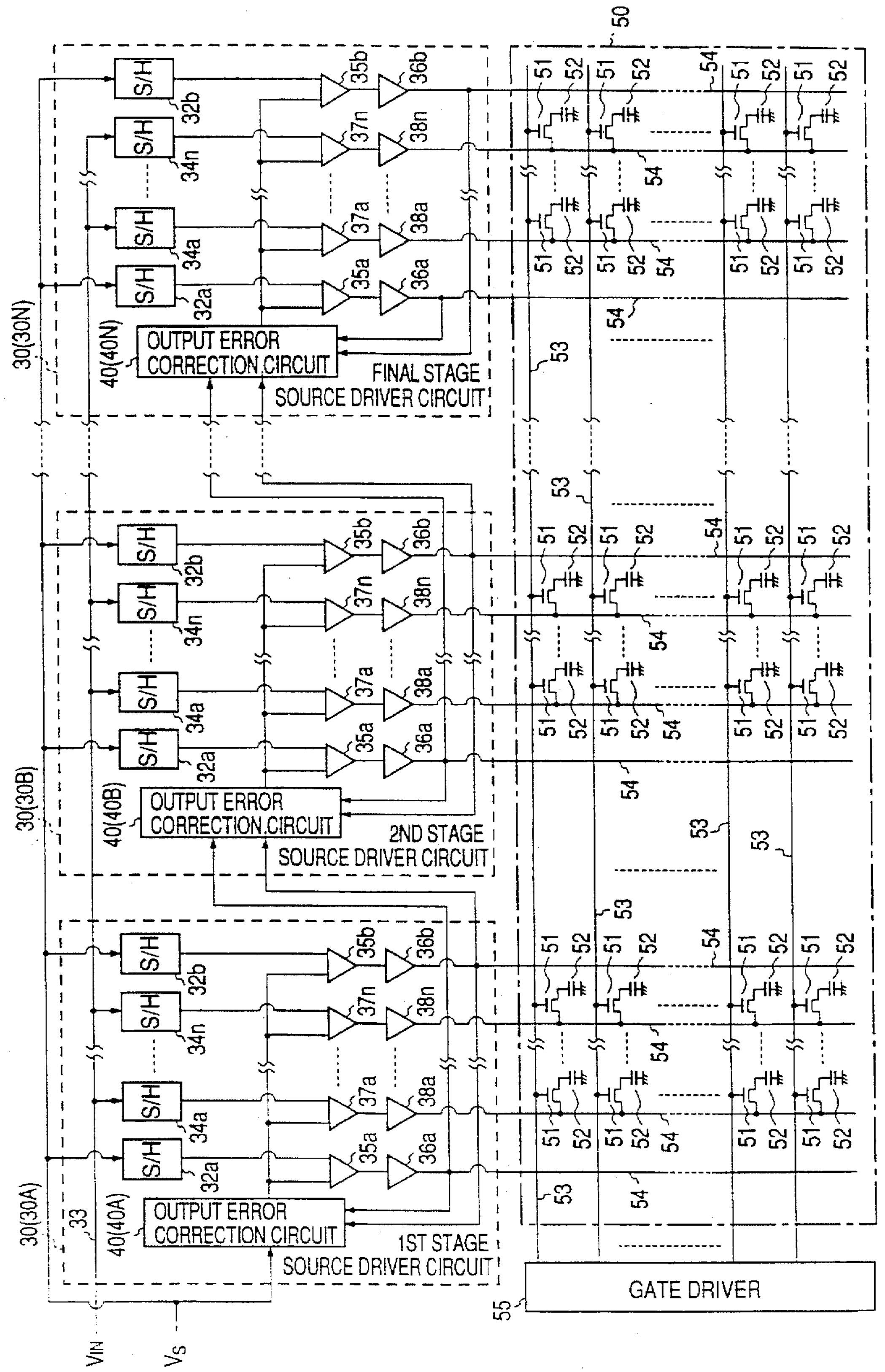
FIG. 12 is a block diagram showing a construction of a source driver circuit device according a fourth embodiment of the present invention for driving a liquid crystal display device.

Next, there will be described a driver circuit according to a fourth embodiment of the present invention for driving a liquid crystal display device with reference to FIGS. 12 and 13. FIG. 12 shows a liquid crystal display device as a driving object which has been eliminated in the previous embodiments. A driver circuit 30 according to the fourth embodiment comprises, as shown in FIG. 12, an n-number of driver circuits, for example, a first stage driver circuit 30A, a second stage driver circuit 30B, and a final stage driver circuit 30N. Since the second through (N–1)-th driver circuits have the same configuration, the description is done with the initial stage, intermediate stage and final stage driver circuits, for example, thereby driving a liquid crystal display device 50 having a predetermined scale by these three kinds of driver circuits. Three kinds of driver circuits have substantially the same configuration except that the input and output of the signals are different from each other.

The driver circuit 30 comprises a signal line 31 for introducing a reference potential $V_S$ from the outside, first sample-and-hold circuits 32*a* and 32*b* which are provided on both sides of the driver circuit 30 for detecting the reference potential $V_S$ supplied through the signal line 31, a signal line 33 for introducing a video signal $V_{IN}$ supplied from the outside, second sample-and-hold circuits 34*a*–34*n* each receiving the video signal $V_{IN}$, regulation circuits 35*a* and 35*b* for regulating and composing the reference potential $V_S$ supplied from the first sample-and-hold circuits 32*a* and 32*b* and a correction value, output circuits 36*a* and 36*b* for outputting a detection value on the basis of outputs from the regulation circuits 35*a* and 35*b*, regulation circuits 37*a*–37*n* having the same configuration as the regulation circuits 35*a* and 35*b* and regulating the video signal $V_{IN}$ on the basis of the correction value, output circuits 38*a*–38*n* for outputting a video signal after correcting the level on the basis of outputs of the regulation circuits 37*a*–37*n*, and an output error correction circuit 40 for correcting errors of the output potential level on the basis of the outputs of the output circuits 36*a* and 36*b* for the level detection.

The sample-and-hold circuits 32*a* and 32*b*, the regulation circuits 35*a*–35*n* and the output circuits 36*a* and 36*b* for the output level detection detect the reference potential $V_S$ to supply it to the output error correction circuit 40 in which the supplied potential error between both sides of the IC chip is corrected. An output error correction circuit 40A of the first stage driver circuit 30A also receives the reference potential $V_S$. Output error correction circuit 40B–40N of the second stage to final stage driver circuits 30B–30N receive the detection levels of both sides of the former stage driver circuit chips 3OA-30(N–1). Since the final stage driver circuit 30N uses the potential level detected from both sides of this chip only in own chip, the circuit 30A does not have a signal line for supplying the detected potential level to the next stage. This is the different portion from the initial and intermediate stage driver circuit chips.

The driver circuit 30 having the above configuration drives sources of thin film transistors (hereunder abbreviated TFT) 51 constructing a liquid crystal display device (hereunder abbreviated LCD) 50 which is schematically shown in FIG. 12. The LCD 50 comprises a plurality of TFT 51 arranged in a matrix, a plurality of capacitors 52 each of which is provided on a drain side of each TFT 51 for storing charges, a plurality of gate potential supply lines 53 for connecting gates of the TFT 51 arranged in the row direction, and a plurality of video signal supply lines 54 to which sources of the TFT 51 arranged in the column direction are respectively connected and which supply outputs of the output circuits 38*a*–38*n* to the sources of the TFT 51. Each of one ends of the gate potential supply lines 53 is connected to a gate driver 55 for supplying a gate potential to each TFT 51.

Next, there will be described in detail a concrete example of a source driver circuit according to a fourth embodiment of the present invention in reference with FIGS. 13 and 14. FIG. 13 shows a circuit example of the first stage driver circuit 30A, and FIG. 14 shows a circuit example of the second through the final stage driver circuits 30B–30N.

Figure 2:
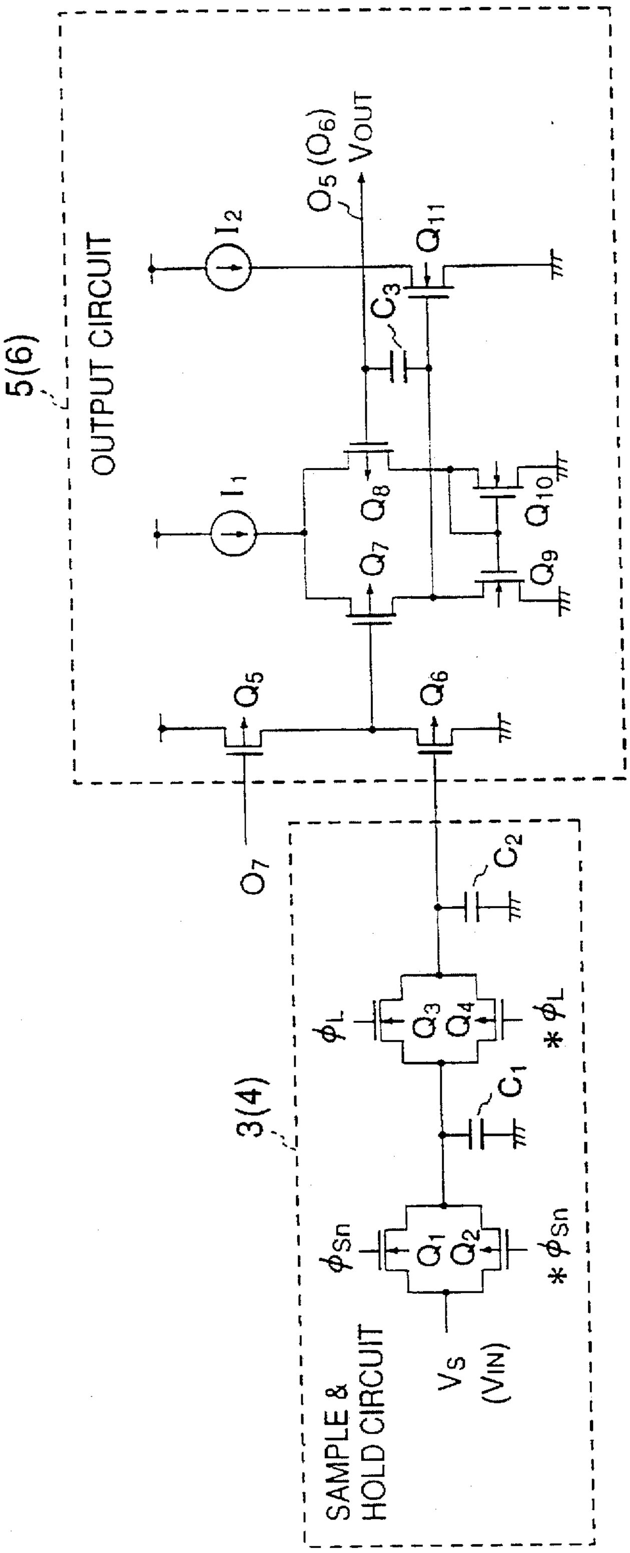
FIG. 2 is a circuit diagram showing a constructive example of a sample-and-hold circuit and an output circuit of the source driver circuit device.
Figure 13:
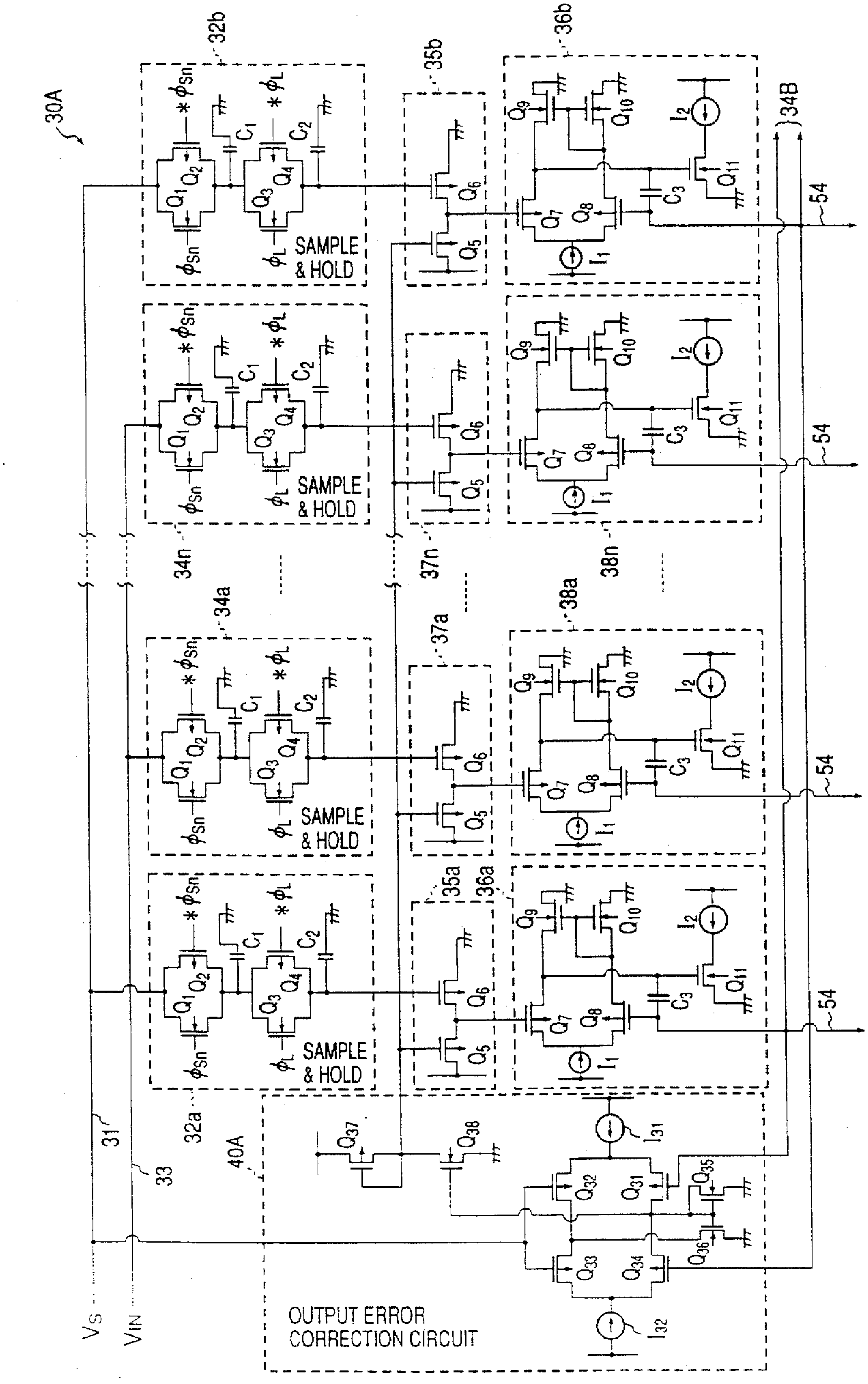
FIG. 13 is a circuit diagram showing a detailed configuration of a first stage source driver circuit device shown in FIG. 12.

In FIG. 13, a first stage driver circuit 30A comprises an output error correction circuit 40A having substantially the same constitution as the first output error correction circuit 7A in the first embodiment. Furthermore, the sample-and-hold circuit 32*a*, 32*b*, or any of 34*a*–34*n* has substantially the same configuration as the sample-and-hold circuit 3 or 4 which is shown in the left side of FIG. 2. Moreover, the regulation circuit 35*a*, 35*b*, or any of 37*a*–37*n* and the output circuit 36*a*, 36*b* or any of 38*a*–38*n* have substantially the same configuration as the output circuit 5 or 6 which is shown in the right side of FIG. 2.

Figure 14:
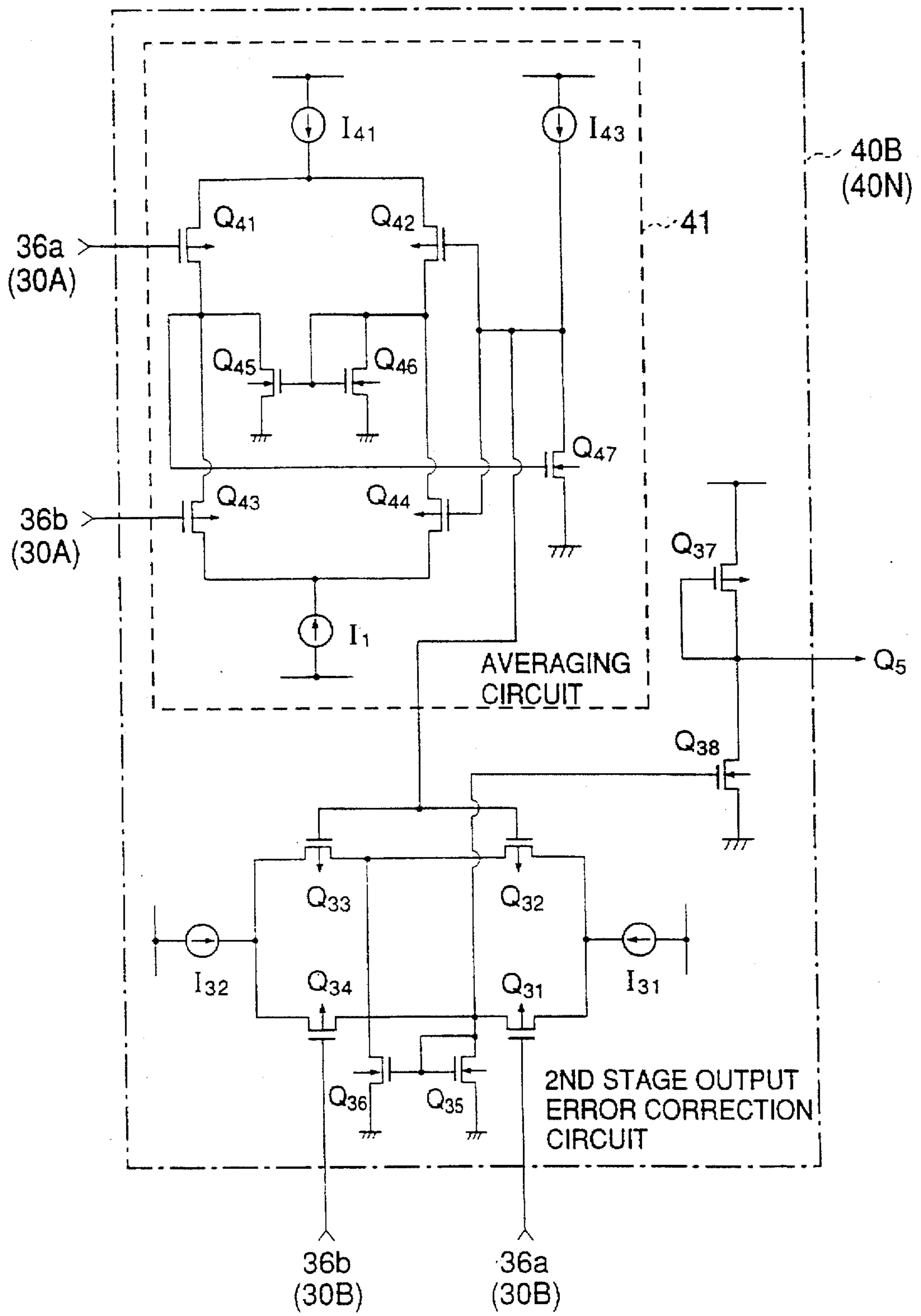
FIG. 14 is a circuit diagram showing a detailed configuration of a source driver circuit device after second stage shown in FIG. 12.

Next, there is described a detailed circuitry after the second stage driver circuit 30B in reference with FIG. 14. In an output error correction circuit 40B shown in FIG. 14, levels on the both sides of the chip of the first stage driver circuit 30A are supplied from the output circuits 36*a* and 36*b* to respective gate of P-channel MOS transistors $Q_{41}$ and $Q_{43}$, and levels on the both sides of the chip of own (second) stage driver circuit 30B are supplied from the output circuits 36*a* and 36*b* to particular gate of transistors $Q_{31}$ and $Q_{34}$. The second stage correction circuit 40B does not supply the reference potential $V_S$ to the junction point between the gates of the transistors $Q_{32}$ and $Q_{33}$ in the manner of the first stage correction circuit 40A, but supplies the detection levels of the previous stage output circuits 36*a* and 36*b* to the junction point of the gates after averaging by an averaging circuit 41.

The averaging circuit 41 comprises, as shown in FIG. 14, P-channel MOS transistors $Q_{41}$, $Q_{42}$, $Q_{43}$ and $Q_{44}$, N-channel MOS transistors $Q_{45}$, $Q_{46}$ and $Q_{47}$, and constant current sources $I_{41}$, $I_{42}$ and $I_{43}$.

Figure 15:
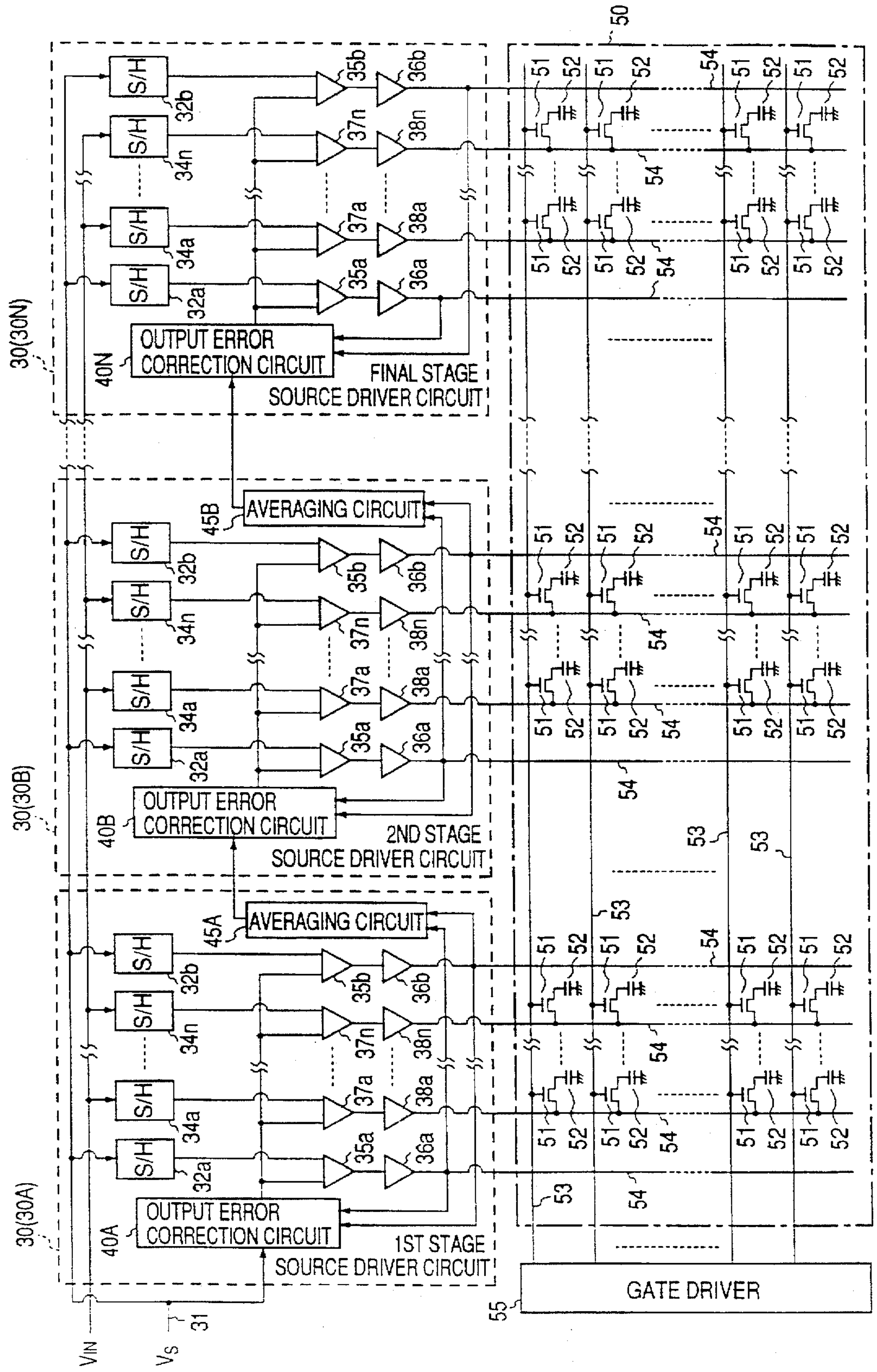
FIG. 15 is a block diagram showing a construction of a source driver circuit device according to a fifth embodiment of the present invention for driving a liquid crystal display device.

Next, there is described in detail a driver circuit according to a fifth embodiment of the present invention in reference with FIG. 15.

In FIG. 15, driver circuits from the first stage to previous one of last stage in the driver circuits 30A–30N respectively comprise averaging circuits 45A and 45B for averaging the outputs of the output circuits 36*a* and 36*b* which perform a level detection on the both sides of the chip itself. Even though FIG. 15 does not disclose them, a plurality of the averaging circuits 45A through 45(N−1) are provided in the case of the fifth embodiment. Also, even though the driver circuit of the fourth embodiment supplies the level detection outputs of the previous stages to the output error correction circuits 40 of the later stages as they are, the driver circuit 30 of the fifth embodiment supplies the averaged outputs of the previous stages, namely, the outputs of the averaging circuits 45A through 45(N−1), to the output error correction circuits 40B–40N of the second stage through the final stage except the first stage.

Figure 16:
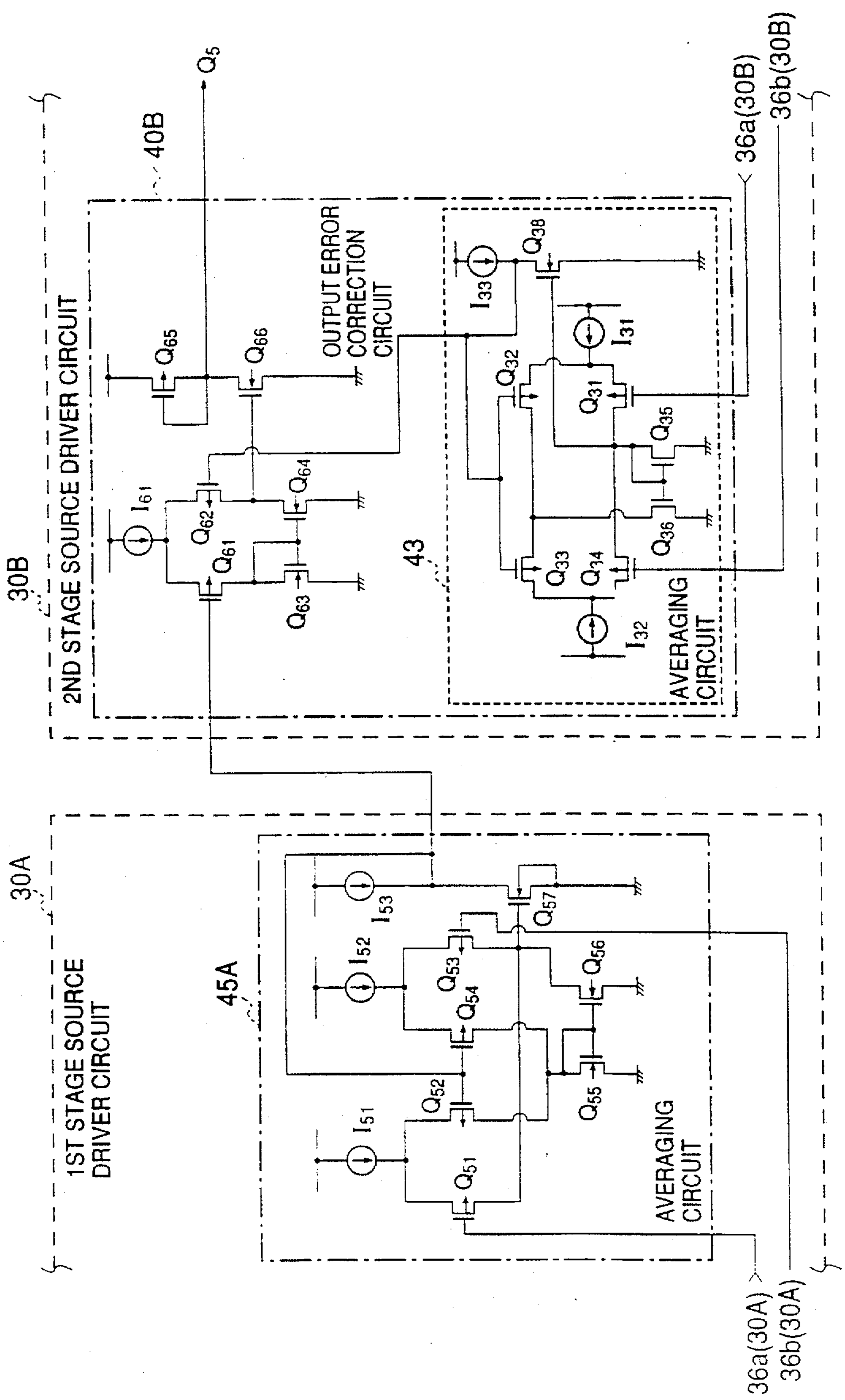
FIG. 16 is a circuit diagram showing a detailed configuration of the source driver circuit device shown in FIG. 15.

Since the characterized portion of the concrete circuitry of the fifth embodiment shown in FIG. 15 is a portion from the previous stage averaging circuit 45A to the next stage, FIG. 16 shows the characterized portion of the detailed circuitry.

In FIG. 16, the previous stage averaging circuit 45A has substantially the same construction of the averaging circuit 41 provided in the output error correction circuit 40B shown in FIG. 14, and more particularly, comprises P-channel MOS transistors $Q_{51}$, $Q_{52}$, $Q_{53}$ and $Q_{54}$, N-channel transistors $Q_{55}$, $Q_{56}$ and $Q_{57}$, and constant current sources $I_{51}$, $I_{52}$ and $I_{53}$.

Furthermore, in FIG. 16, the second stage output error correction circuit 40B comprises an averaging circuit 43 to which the levels on the both sides of the chip of own stage (second stage) are supplied through the output circuits 36*a* and 36*b*. The averaging circuit 43 has substantially the same construction as the lower portion of the output error correction circuit 40A shown in FIG. 13.

The averaging circuits 41 and 43 respectively supply their outputs to particular gate of the P-channel MOS transistors $Q_{61}$ and $Q_{62}$. A correction output generating portion including the transistors $Q_{61}$ and $Q_{62}$ further comprises a P-channel MOS transistor $Q_{65}$, N-channel MOS transistors $Q_{63}$, $Q_{64}$ and $Q_{66}$, and a constant current source $I_{61}$. An output of the junction point between the transistors $Q_{65}$ and $Q_{66}$ is supplied as a correction output to gates of the transistors $Q_5$ of the regulation circuits 35*a*, 35*b*, 37*a*–37*n*.

Figure 17:
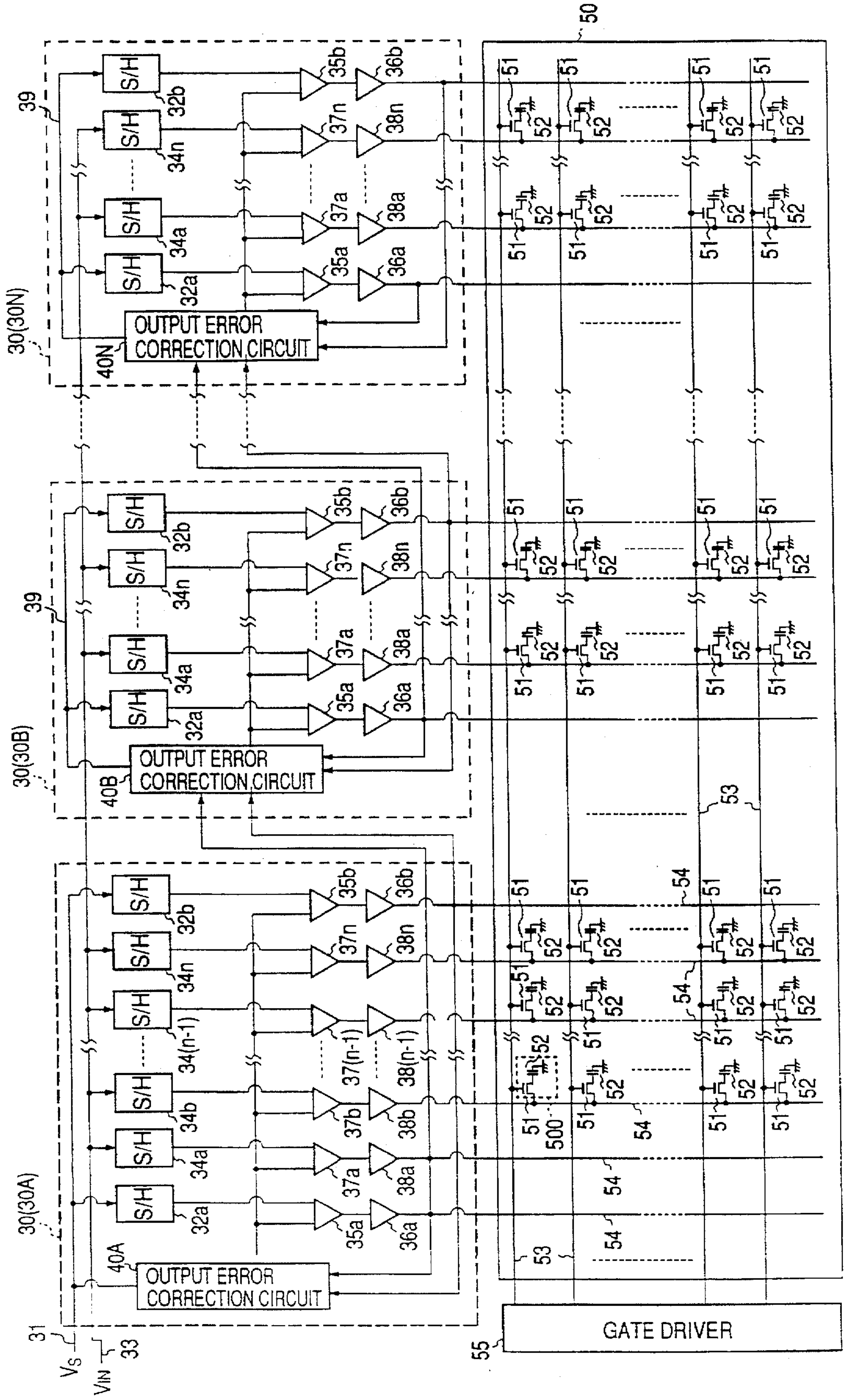
FIG. 17 is a block diagram showing a construction of a source driver circuit device according to a sixth embodiment of the present invention for driving a liquid crystal display device.
Figure 18:
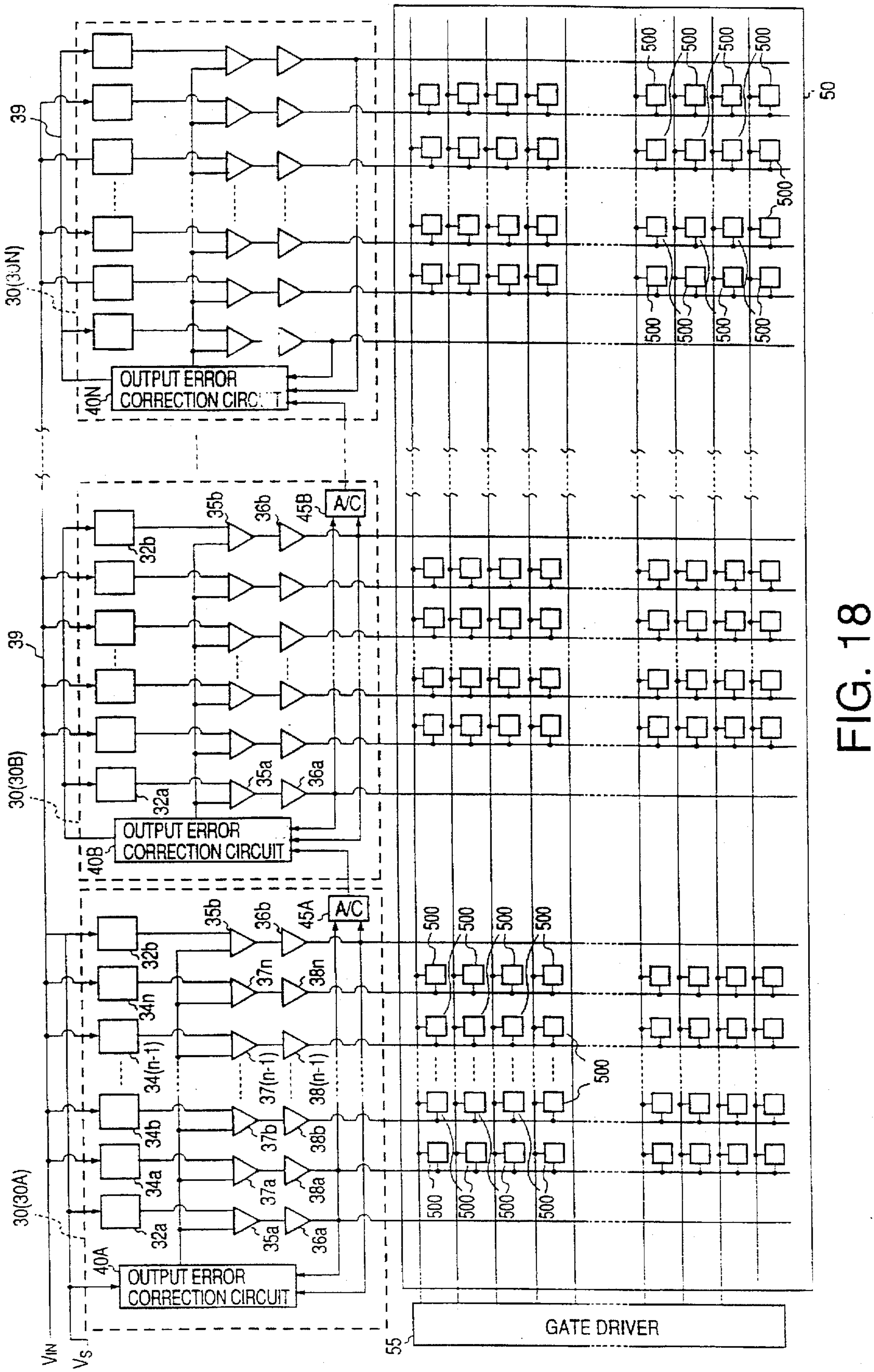
FIG. 18 is a block diagram showing a source driver circuit device according to a seventh embodiment of the present invention for driving a liquid crystal display device.

Even though the reference potential $V_S$ is supplied to the entire driver circuit 30A–30N sequentially connected in the fourth and fifth embodiments, the present invention is not limited in the construction. For example, to the level detection sample-and-hold circuit 32*a* and 32*b* of the later stage driver circuit except the first stage, the output of the output error correction circuit 40 of own stage may be supplied as the reference potential. FIG. 17 shows a source driver circuit according to a seventh embodiment for driving a liquid crystal display device. In the driver circuit device according to the seventh embodiment, the outputs of the output error correction circuit 40B–40N from the second to final stages are respectively supplied to the level detection sample-and-hold circuits 32*a* and 32*b* on the both sides of the own chip through reference level signal supply lines 39. Since other constructions are the same as the driver circuit device according to the fourth embodiment, a duplicated description is omitted.

Furthermore, a driver circuit according to a seventh embodiment supplies as the reference potential the outputs of the output error correction circuits 40B–40N in the second through the final stages to the sample-and-hold circuits 32*a* and 32*b* provided on the both sides of own chip through the signal lines in the same manner of the sixth embodiment. Since other constructions such as a connection relationship between the previous stage averaging circuits 45A–45(N−1) and the next stage correction circuits 40B–40N and the circuitry thereof are the same as the fifth embodiment explained by using FIGS. 15 and 16, a duplicated description is omitted.

Even though the first through seventh embodiments have two sample-and-hold circuits 35*a* and 35*b* for detecting the levels of each chip and arranged at the both sides of each chip, the present invention is not limited with respect to a number of level detection circuits. Accordingly, a plurality of the level detection circuits more than two per one chip can be provided. For example, three sample-andhold circuits may be provided in the manner two are arranged at both ends of the chip and one is provided at the center portion, and more than four sample-and-hold circuits may be provided in the manner of having the predetermined intervals being equalized with one another.

What is claimed is:

1. A source driver circuit device for driving source lines of a plural number of thin film transistors (TFT) arranged in a matrix shape and constituting a liquid crystal display device, comprising a plurality of sample-and-hold circuits arranged in an order for sequentially sampling an input video signal to obtain sampling values;

a plurality of signal output circuits for respectively generating voltage outputs corresponding to holding values of said plurality of sample-and-hold circuits;

a plurality of reference value sample-and-hold circuits each of which is provided with a predetermined number of said sample-and-hold circuits, and for sampling a reference potential;

a plurality of sample value output circuits for respectively generating voltage outputs corresponding to holding levels of said plurality of reference value sample-and-hold circuits; and an output error correction circuit for performing an output level correction in each of said plurality of signal output circuits as a function of a value difference between said reference potential and an average value of a plurality of outputs issued from said plurality of sample value output circuits wherein said reference value sample-and-hold circuits include first and second value sample-and-hold circuits in parallel with said plurality of signal sample-and-hold circuits in one integrated circuit (IC) chip; and wherein said output error correction circuit comprises a first transistor of a P-channel type having a gate receiving a detection level of said first value sample-and-hold circuit and a source connected to a first constant current source, a second transistor of a P-channel type having a source connected to said source of the first transistor to thereby connect said second transistor with said first current source at a junction point of the first and second transistors and a gate receiving said reference potential, a third transistor of a P-channel type having a gate connected to the gate of the second transistor and a source connected to a second constant current source, a fourth transistor of a P-channel type having a gate receiving a detection level of said second level sample-and-hold circuit and a source connected to the source of the third transistor and receiving said second current source through a junction point of the third and fourth transistors, a fifth transistor of an N-channel type having a drain and a gate connected to a junction point of drains of said second and third transistors, a sixth transistor of an N-channel type having a gate connected to said gate of said fifth transistor and a drain connected to a junction point of drains of said first and fourth transistors, a seventh transistor of an N-channel type having a gate connected to the junction point of said drains of said first and fourth transistors, and an eighth transistor of a P-channel type having a drain and a gate connected to a source of said seventh transistor and outputting a correction output to each of said plurality of sample value output circuits and to said plurality of signal output circuits.

2. A source driver circuit device for driving source lines of a plural number of thin film transistors (TFT) arranged in a matrix shape and constituting a liquid crystal display device, comprising a plurality of sample-and-hold circuits arranged in an order for sequentially sampling an input video signal to obtain sampling values;

a plurality of signal output circuits for respectively generating voltage outputs corresponding to holding values of said plurality of sample-and-hold circuits;

a plurality of reference value sample-and-hold circuits each of which is provided with a predetermined number of said sample-and-hold circuits, and for sampling a reference potential;

a plurality of sample value output circuits for respectively generating voltage outputs corresponding to holding levels of said plurality of reference value sample-and-hold circuits; and an output error correction circuit for performing an output level correction in each of said plurality of signal output circuits as a function of a value difference between said reference potential and an average value of a plurality of outputs issued from said plurality of sample value output circuits wherein said source driver circuit device further comprising a plurality of integrated circuit (IC) driver chips including said plurality of sample-and-hold circuits, and each chip including a first input terminal for receiving said video signal, a second input terminal for receiving a first reference signal from the outside, a third input terminal for receiving a second reference signal generated in a previous stage IC driver chip, a first output terminal for outputting said video signal, a second output terminal for outputting said first reference signal, and a third output terminal for outputting as a present second reference signal an output of one of the plurality of sample value output circuits; and wherein said plurality of the driver IC chips are sequentially connected with one another by corresponding input and output terminals with each other, and each of the driver IC chips drives a corresponding group of a plurality of TFT of said liquid crystal display device.

3. A source driver circuit device for driving source lines of a plural number of thin film transistors (TFT) arranged in a matrix shape and constituting a liquid crystal display device, comprising a plurality of sample-and-hold circuits and arranged in an order for sequentially sampling an input video signal to obtain sampling values;

a plurality of signal output circuits for respectively generating voltage outputs corresponding to holding values of said plurality of sample-and-hold circuits;

a plurality of reference value sample-and-hold circuits each of which is provided with a predetermined number of said sample-and-hold circuits, and for sampling a reference potential;

a plurality of sample value output circuits for respectively generating voltage outputs corresponding to holding levels of said plurality of reference value sample-and-hold circuits; and an output error correction circuit for performing an output level correction in each of said plurality of signal output circuits as a function of a value difference between said reference potential and an average value of a plurality of outputs issued from said plurality of sample value output circuits wherein said reference value sample-and-hold circuits include first and second value sample-and-hold circuits in parallel with said plurality of signal sample-and-hold circuits in one integrated circuit (IC) chip; and wherein said output error correction circuit comprises a first transistor of a P-channel type having a gate receiving a detection level of said first value sample-and-hold circuit and a source connected to a first constant current source, a second transistor of a P-channel type having a source connected to said source of the first transistor to thereby connect said second transistor with said first current source at a junction point of the first and second transistors and a gate receiving said reference potential, a third transistor of a P-channel type having a gate connected to the gate of the second transistor and a source connected to a second constant current source, a fourth transistor of a P-channel type having a gate receiving a detection level of said second level sample-and-hold circuit and a source connected to the source of the third transistor and receiving said second current source through a junction point of the third and fourth transistors, a fifth transistor of an N-channel type having a drain and a gate connected to a junction point of drains of said second and third transistors, a sixth transistor of an N-channel type having a gate connected to said gate of said fifth transistor and a drain connected to a junction point of drains of said first and fourth transistors, a seventh transistor of an N-channel type having a gate connected to the junction point of said drains of said first and fourth transistors, and an eighth transistor of a P-channel type having a drain and a gate connected to a source of said seventh transistor and outputting as a correction output a junction point voltage to each of said plurality of sample value output circuits and to said plurality of signal output circuits;

said plurality of first stage integrated circuit (IC) driver chips each including a first input terminal for receiving said video signal, a second input terminal for receiving a first output reference signal a first output terminal for outputting said video signal, a second output terminal for outputting said first reference signal, and a third output terminal for outputting as a present second reference signal, an output of one of the plurality of sample value output circuit;

wherein said source driver circuit further comprises a plurality of (IC) chips including a second stage (IC) chip through final stage integrated circuit (IC) chip , each of said second through final stages integrated circuit (IC) chips including a first further stage input terminal for receiving a video signal, a second further stage input terminal for receiving said first reference signal, a third input terminal for receiving a second reference signal generated in a previous stage IC driver chip, a first output terminal for outputting said video signal, a second output terminal for outputting said first reference signal, and a third output terminal for outputting as a present second reference signal an output of a further stage sample value output circuit; and wherein said plurality of the driver IC chips are sequentially connected with one another by corresponding input and output terminals with each other, and each of the driver IC chips drives a corresponding group of a plurality of TFT of said liquid crystal display device.

4. A source driver circuit device for driving source lines of a plural number of thin film transistors (TFT) arranged in a matrix shape and constituting a liquid crystal display device, comprising a plurality of sample-and-hold circuits arranged in an order for sequentially sampling an input video signal to obtain sampling values;

a plurality of signal output circuits for respectively generating voltage outputs corresponding to holding values of said plurality of sample-and-hold circuits;

a plurality of reference value sample-and-hold circuits each of which is provided with a predetermined number of said sample-and-hold circuits, and for sampling a reference potential;

a plurality of sample value output circuits for respectively generating voltage outputs corresponding to holding levels of said plurality of reference value sample-and-hold circuits; and an output error correction circuit for performing an output level correction in each of said plurality of signal output circuits as a function of a value difference between said reference potential and an average value of a plurality of outputs issued from said plurality of sample value output circuits wherein said reference value sample-and-hold circuits include first and second value sample-and-hold circuits in parallel with said plurality of signal sample-and-hold circuits in one integrated circuit (IC) chip; and wherein said output error correction circuit comprises a first transistor of a P-channel type having a gate receiving a detection level of said first value sample-and-hold circuit and a source connected to a first constant current source, a second transistor of a P-channel type having a source connected to said source of the first transistor to thereby connect said second transistor with said first current source at a junction point of the first and second transistors and a gate receiving said reference potential, a third transistor of a P-channel type having a gate connected to the gate of the second transistor and a source connected to a second constant current source, a fourth transistor of a P-channel type having a gate receiving a detection level of said second level sample-and-hold circuit and a source connected to the source of the third transistor and receiving said second current source through a junction point of the third and fourth transistors, a fifth transistor of an N-channel type having a drain and a gate connected to a junction point of drains of said second and third transistors, a sixth transistor of an N-channel type having a gate connected to said gate of said fifth transistor and a drain connected to a junction point of drains of said first and fourth transistors, a seventh transistor of an N-channel type having a gate connected to the junction point of said drains of said first and fourth transistors, and an eighth transistor of a P-channel type having a drain and a gate connected to a source of said seventh transistor and outputting as a correction output a junction point voltage to each of said plurality of sample value output circuits and to said plurality of signal output circuits;

wherein said source driver circuit device further includes a plurality of said one integrated circuit (IC) chip constituting a first through final stage (IC) chip, each IC chip including said plurality of reference value sample-and-hold circuits and wherein each stage has a first reference potential and a second reference potential which is generated in each driver circuit of the first through one before the final stage (IC) chip;

wherein said first reference potential is supplied to a first stage output error correction circuit and to value detection sample-and-hold circuits provided in parallel on said driver IC chip of each of said first through one before final stage, respectively, and wherein said second reference potential is issued from said level detection sample-and-hold circuits provided on two locations on said integrated (IC) chip of each of the first stage through said one before final stage, and is supplied to the output error correction circuits of the next stage driver IC chips.

5. The source driver circuit device according to claim 4, wherein said output error correction circuit in any of a second through the final stages comprises a first averaging circuit for averaging said second reference potentials which are detected from the both sides of said driver IC chip in the previous stage, and a second averaging circuit for receiving an output of said first averaging circuit as said reference level and for averaging said second reference potentials whereby a new internal reference potential is output.

6. A source driver circuit device for driving source lines of a plural number of thin film transistors (TFT) arranged in a matrix shape and constituting a liquid crystal display device, comprising a plurality of sample-and-hold circuits arranged in an order for sequentially sampling an input video signal to obtain sampling values;

a plurality of signal output circuits for respectively generating voltage outputs corresponding to holding values of said plurality of sample-and-hold circuits;

a plurality of reference value sample-and-hold circuits each of which is provided with a predetermined number of said sample-and-hold circuits, and for sampling a reference potential;

a plurality of sample value output circuits for respectively generating voltage outputs corresponding to holding levels of said plurality of reference value sample-and-hold circuits; and an output error correction circuit for performing an output value correction in each of said plurality of signal output circuits as a function of a value difference between said reference potential and an average value of a plurality of outputs issued from said plurality of sample value output circuits wherein said reference value sample-and-hold circuits include first and second value sample-and-hold circuits which are provided in parallel with said plurality of signal sample-and-hold circuits in one integrated circuit (IC) chip; and wherein said output error correction circuit comprises a first transistor of a P-channel type having a gate receiving a detection value of said first value sample-and-hold circuit and a source connected to a first constant current source, a second transistor of a P-channel type having a source connected to said source of the first transistor to thereby connect said second transistor with said first current source at a junction point of the first and second transistors and a gate receiving said reference potential, a third transistor of a P-channel type having a gate connected to the gate of the second transistor and a source connected to a second constant current source, a fourth transistor of a P-channel type having a gate receiving a detection value of said second level sample-and-hold circuit and a source connected to the source of the third transistor and receiving said second current source through a junction point of the third and fourth transistors, a fifth transistor of an N-channel type having a source and a gate connected to a junction point of drains of said second and third transistors, a sixth transistor of an N-channel type having a gate connected to said gate of said fifth transistor and a drain connected to a junction point of drains of said first and fourth transistors, a seventh transistor of an N-channel type having a gate connected to the junction point of said drains of said first and fourth transistors, and an eighth transistor of a P-channel type having a drain and a gate connected to a source of said seventh transistor and outputting as a correction output a junction point voltage to each of said value and signal sample-and-hold circuits;

wherein a first stage driver IC comprises a first pair of two value detection means for detecting values of an external reference signal on two locations on the chip, an output error correction circuit for generating a correction signal by averaging two detected outputs from said first pair of two value detection means, and an averaging circuit for receiving and averaging said two detected outputs from said value detection means so as to supply an averaged reference value as said reference value to a next stage driver IC chip;

wherein an intermediate stage driver IC chip comprises a second pair of two value detection means for detecting values of the external reference signal at two locations on the chip, an output error correction circuit for generating a correction signal by averaging two detected outputs from said second pair of two value detection means on the basis of said reference value supplied from said averaging circuit of a previous stage, and an averaging circuit for receiving and averaging said two detected outputs from said value detection means of this stage so as to supply an averaged reference value as said reference value to a next stage driver IC chip; and wherein a final stage driver IC chip comprises a final pair of two value detection means for detecting values of the external reference signal on two locations on the chip, and an output error correction circuit for generating a correction signal by averaging two detected outputs from said final pair of value detection means of this stage on the basis of said reference level supplied from said averaging circuit of a previous stage.

7. The driver circuit device according to claim 11, wherein said averaging circuit provided in each stage except the final stage comprises a first transistor of a P-channel type having a gate supplied by an output from each said stage value detection means except the final stage value detection means and a source connected to a first constant current source, a second transistor of a P-channel type having a source connected to a junction point of the first transistor and the first constant current source, a third transistor of a P-channel type having a gate to which another output from said each stage value detection means except the final stage value detection means is supplied and a source connected to a second constant current source, a fourth transistor of a P-channel type having a source connected to a junction point of the third transistor and the second constant current source and a gate connected to the gate of said second transistor, a fifth transistor of an N-channel type having a drain connected to a junction point of drains of said second and fourth transistors, a sixth transistor of an N-channel type having a drain connected to a junction point of drains of said first and third transistor and a gate connected to a gate of said fifth transistor, and a seventh transistor of an N-channel type having a gate connected to the junction point of said drains of the first and third transistors and a drain connected to a third constant current source, thereby supplying an averaging output as a reference value to the output error correction circuit of a next stage driver IC chip through a junction point between the third current source and the seventh transistor.

8. A source driver circuit device for driving source lines of a plural number of thin film transistors (TFT) arranged in a matrix shape and constituting a liquid crystal display device, comprising a plurality of sample-and-hold circuits arranged in an order for sequentially sampling an input video signal to obtain sampling values;

a plurality of signal output circuits for respectively generating voltage outputs corresponding to holding values of said plurality of sample-and-hold circuits;

a plurality of reference value sample-and-hold circuits each of which is provided with a predetermined number of said sample-and-hold circuits, and for sampling a reference potential;

a plurality of sample value output circuits for respectively generating voltage outputs corresponding to holding levels of said plurality of reference value sample-and-hold circuits; and an output error correction circuit for performing an output level correction in each of said plurality of signal output circuits as a function of a level difference between said reference potential and an average value of a plurality of outputs issued from said plurality of sample value output circuits wherein said reference value sample-and-hold circuits include first and second value sample-and-hold circuits in parallel with said plurality of signal sample-and-hold circuits in one integrated circuit (IC) chip; and wherein said output error correction circuit comprises a first transistor of a P-channel type having a gate receiving a detection level of said first value sample-and-hold circuit and a source connected to a first constant current source, a second transistor of a P-channel type having a source connected to said source of the first transistor to thereby connect said second transistor with said first current source at a junction point of the first and second transistors and a gate receiving said reference potential, a third transistor of a P-channel type having a gate connected to the gate of the second transistor and a source connected to a second constant current source, a fourth transistor of a P-channel type having a gate receiving a detection level of said second level sample-and-hold circuit and a source connected to the source of the third transistor and receiving said second current source through a junction point of the third and fourth transistors, a fifth transistor of an N-channel type having a drain and a gate connected to a junction point of drains of said second and third transistors, a sixth transistor of an N-channel type having a gate connected to said gate of said fifth transistor and a drain connected to a junction point of drains of said first and fourth transistors, a seventh transistor of an N-channel type having a gate connected to the junction point of said drains of said first and fourth transistors, and an eighth transistor of a P-channel type having a drain and a gate connected to a source of said seventh transistor and outputting a correction output to each of said plurality of sample value output circuits and to said plurality of signal output circuits;

wherein said source driver circuit device further includes a plurality of said one integrated circuit (IC) chip constituting a first through final stage (IC) chip, IC chip including said plurality of reference value sample-and-hold circuits, and wherein said reference level comprises a first externally supplied reference potential signal, a second reference potential signal which is generated in a stage driver circuit device in each of the first stage chip through one stage chip before the final stage (IC) chip, and a third reference potential signal which is generated in each of a second stage chip through said final stage driver IC chips;

wherein said first reference potential signal is supplied to a first stage output error correction circuit and said two sample-and-hold circuits for a value detection which are provided on two locations on said first stage driver IC chip;

wherein said second reference potential signal is respectively issued from said value detection sample-and-hold circuits provided on two locations on each of the first through one before the final stages driver IC chips, and is supplied to the output error correction circuit provided in a next stage driver IC chip; and wherein said third reference potential signal is generated by a second through a final stage output error correction circuits on the basis of a detection level supplied from the first through said one before the final stage driver IC chips, and is supplied as the reference level to two level detection sample-and-hold circuits which are provided on two locations on a driver IC chip in a stage including said output error correction circuit.

9. The driver circuit device according to claim 8;

wherein said second reference potential signal is generated by an averaging circuit for averaging two detection levels which are detected by two sample-and-hold circuits provided on the both sides of the driver IC chip in the first through one before the final stage, and is supplied to the next stage output error correction circuit.

* * * * *